United States Patent [19]

Takechi et al.

[11] Patent Number: 4,990,878
[45] Date of Patent: Feb. 5, 1991

[54] SUPERCONDUCTING MAGNET DEVICE

[75] Inventors: Moriaki Takechi; Tatsuya Oue, both of Ako City, Japan

[73] Assignee: Mitsubishi Denki Kabushiki Kaisha, Japan

[21] Appl. No.: 385,541

[22] Filed: Jul. 27, 1989

[30] Foreign Application Priority Data

Jul. 27, 1988 [JP] Japan .................. 63-185565

[51] Int. Cl.⁵ .............................................. H01F 7/00
[52] U.S. Cl. ................................... 335/301; 335/216; 505/1; 324/318
[58] Field of Search ............... 335/216, 301; 324/318, 324/319, 320

[56] References Cited

U.S. PATENT DOCUMENTS

| | | | |
|---|---|---|---|
| 4,651,117 | 3/1987 | Kawaguchi et al. | 335/216 |
| 4,797,646 | 1/1989 | Saji et al. | 335/301 |
| 4,803,452 | 2/1989 | Saji et al. | 335/301 |
| 4,833,434 | 5/1989 | Takechi | 335/217 |
| 4,851,799 | 7/1989 | Hilal | 335/301 |
| 4,868,707 | 9/1989 | Takechi | 335/216 X |

FOREIGN PATENT DOCUMENTS 51-32479 9/1976 Japan.
62-194842 8/1987 Japan.

Primary Examiner—George Harris
Attorney, Agent, or Firm—Leydig, Voit & Mayer

[57] ABSTRACT

A superconducting magnet device includes a superconducting coil for generating a magnetostatic field, and a pulsating magentic field generating coil disposed on the inner diameter side of the superconducting coil. An inner cylinder of a thermal shielding tank located between the superconducting coil and the pulating magentic field generating coil is maintained at a temperature equal to or lower than the liquid nitrogen temperature. The inner cylinder is made of a superconductor which becomes superconductive at a temperature equal to or higher than the liquid nitrogen temperature. Further, a heating wire for heating the inner cylinder which is in a superconductive state to cause it to become normal conductive is provided on the inner cylinder of the thermal shielding tank in a direction in which it cuts across an induced current loop generated by the excitation of the static magnetic field.

10 Claims, 6 Drawing Sheets

SUPERCONDUCTING MAGNET DEVICE

BACKGROUND OF THE INVENTION

1. Field of the Invention

The present invention relates to a superconducting magnet device, and particularly, to a superconducting magnet device of the type in which a pulsating magnetic field generating coil is disposed on the inner diameter side of a cylindrical static magnetic field generating superconducting coil and which is for use in, for example, a magnetic resonance imaging apparatus or a nuclear magnetic resonance analyzing apparatus.

2. Description of the Related Art

FIG. 1 is a cross-sectional view of one example of a conventional superconducting magnet device. In this device, superconducting coils 1 for generating a static magnetic field, which are in a superconductive state at a temperature of liquid helium, are accommodated within a liquid helium tank 2 filled with liquid helium 3. Supply of the liquid helium 3 into the liquid helium tank 2 and wiring of the superconducting coils 1 is performed through a service port 4 of the liquid helium tank. On the outer side of the liquid helium tank 2 is provided a liquid nitrogen tank 5 with liquid nitrogen 7 contained therein to act as a heat shield. The liquid nitrogen 7 is supplied into the liquid nitrogen tank 5 through a service port 6. Thermal shielding end plates 8 in contact with the liquid nitrogen tank 5 and a thermal shielding inner cylinder 9 in contact with the end plates 8 are maintained at the temperature of liquid nitrogen. All of these components are accommodated in a thermal insulating vacuum tank 10. At the center of the vacuum tank 10 are disposed normal conducting coils 11 for generating a pulsating magnetic field and a spool 12. The superconducting coils 1 and the pulsating magnetic field generating coils 11 in combination generate an associated magnetic field space 13.

Next, the operation of the above-described conventional device will be described below. When cooled by the liquid helium 3, the superconducting coils 1 go into a superconductive state with zero electrical resistance, and generate a static magnetic field without any loss in conduction of a DC current therein.

Since the latent heat of the liquid helium 3 is small, even a small amount of heat which enters from outside causes a large amount of liquid helium to evaporate. In order to cope with this, the superconducting magnet device is insulated or shielded against heat by the provision of the vacuum tank 10, the liquid nitrogen tank 5, the thermal shield end plates 8 and the thermal shielding inner cylinder 9 which are in contact with the liquid nitrogen tank 5, and the end plates 8 and the inner cylinder 9 are maintained at the liquid nitrogen temperature. This prevents heat from getting into the device as much as possible and thus restricts evaporation of the liquid helium 3. The thermal shielding of the inner cylinder 9 is generally made of a metal plate having a high heat conductivity, such as copper or aluminum. A pulsating current is applied to the pulsating magnetic field generating coils 11 which is in a normal conductive state, so as to superimpose a desired pulsating magnetic filed on the magnetostatic field generated by the superconducting coils 1 in the associated magnetic field space 13. Conduction of the pulsating current in the coils 11 generates an induced current in the inner cylinder 9.

As will be clear from the illustration shown in FIG. 1, the inner cylinder 9 surrounds the pulsating magnetic field generating coils 11 in a cylindrical fashion. This arrangement generates a high mutual inductance between inner cylinder 9 and the coils 11. Furthermore, the inner cylinder 9 is cooled to the liquid nitrogen temperature at which the electrical resistance thereof is low. These cause a large amount of induced current to be generated in the inner cylinder 9. The value of the induced current and the current applied to the pulsating magnetic field generating coils 11 have a relationship expressed by an equation (1). The pulsating magnetic field actually generated is the pulsating magnetic field generated by the current in the pulsating magnetic field generating coils 11 and the magnetic field generated by this induced current superimposed thereon, that is, the magnetic field generated by the induced current is added to the pulsating magnetic field oppositely.

$$L\frac{di_2}{dt} + Ri_2 = -M\frac{di_1}{dt} \qquad (1)$$

where
- L: Self-inductance of the thermal shielding inner cylinder
- M: Mutual-inductance between the pulsating magnetic field generating coils and the inner cylinder
- R: Resistance of the inner cylinder
- $i_1$: Current applied to the pulsating magnetic field generating coils
- $i_2$: Induced current in the inner cylinder For example, in a case where a current having a trapezoidal waveform shown in FIG. 2 (A) is applied to the pulsating magnetic field generating coils 11, the current that flows in the inner cylinder 9 is attenuated due to the resistance R of the inner cylinder 9, as shown in FIG. 2 (B). Accordingly, a magnetic field generated in the space 13 by both the currents shown in FIG. 2 (A) and 2 (B) varies with time, as shown in FIG. 2 (C). Hence, if it is desired that a magnetic field having a fixed intensity during a period indicated by T in FIG. 2 (C) is generated in the space 13, a current arranged such that it compensates for variations in the induced current in the inner cylinder 9 (see FIG. 3 (B)) has to be applied to the pulsating magnetic field generating coils 11, as shown in FIG. 3 (A) to provide for a magnetic field having a fixed value (see FIG. 3 (C)). An induced current is also generated in an inner cylinder 10a of the vacuum tank 10 disposed between the inner cylinder 9 and the normal conducting coils 11. However, the vacuum tank 10 has a normal temperature and, hence, a high resistance. Accordingly, the value of the induced current generated in the cylinder 10a is small enough to be attenuated to a neglected value.

In the thus-arranged conventional superconducting magnet device, in order to generate a pulsating magnetic field having a fixed intensity for a predetermined period of time, a current arranged such that it compensates for attenuation of the induced current in the thermal shielding inner cylinder 9 has to be applied to the pulsating magnetic field generating coils being in the normal conductive state, requiring that an exciting power source (not shown) of the pulsating magnetic field generating coils be equipped with this adjusting function.

SUMMARY OF THE INVENTION

The present invention is directed to obviating the above-described shortcomings of the related art, and an object thereof is to provide a superconducting magnet device which is capable of eliminating attenuation of an induced current in the thermal shielding inner cylinder.

To this end, the present invention provides a superconducting magnet device with a thermal shielding inner cylinder made of a superconducting material incorporated therein.

A superconducting magnet device according to the present invention comprises cylindrical superconducting coil means for generating a mgentostatic field; pulsating magnetic field generating coil means provided on the inner diameter side of the superconducting coil means; a cooling tank accommodating the superconducting coil means therein in a cooled, superconductive state; thermal shielding tank means surrounding the cooling tank and cooling the same from the outside thereof, the thermal shielding tank means including an inner cylinder portion, an outer cylinder portion and end plates disposed at the two ends of the inner and outer cylinder portions to connect the same, the inner cylinder portion located between the superconducting coil means and the pulsating magnetic field generating coil means being made of a superconducting material; and a thermal insulating vacuum tank surrounding the thermal shielding tank means and thereby restricting entry of heat from outside.

In the superconducting magnet device according to the present invention, the thermal shielding inner cylinder through which an induced current flows is cooled to the liquid nitrogen temperature and is therefore in a superconductive state. In consequence, the electrical resistance of the inner cylinder vanishes, and attenuation of the induced current caused by the resistance of the inner cylinder can be therefore eliminated, ensuring generation of a magnetic field having a fixed intensity.

DESCRIPTION OF THE PREFERRED EMBODIMENTS

Figure 1:
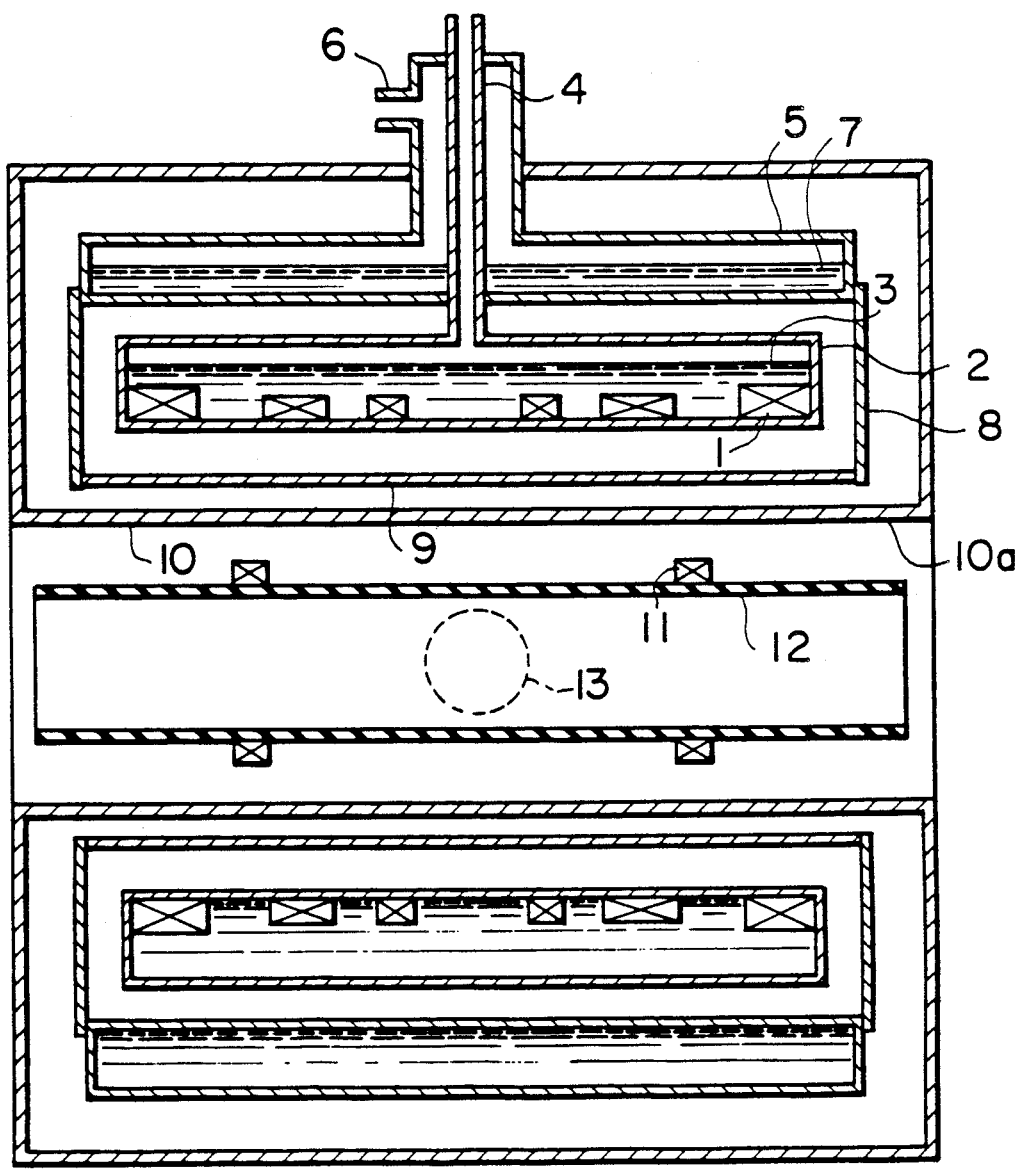
FIG. 1 is a cross-sectional, view of a conventional superconducting magnet device.
Figure 2A:
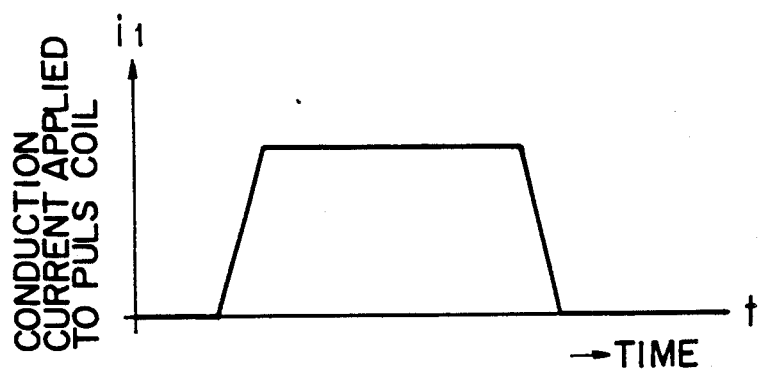
FIG. 2 respectively shows the waveform of a current applied to pulsating magnetic field generating coil in the superconducting magnet device of FIG. 1, that of an induced current in a inner cylinder and an output magnetic field.
Figure 2B:
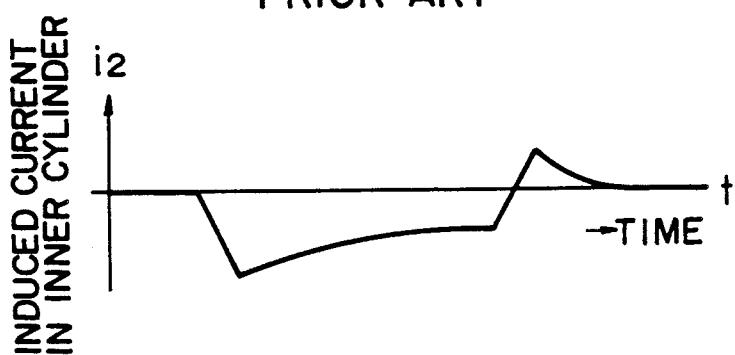
Figure 2C:
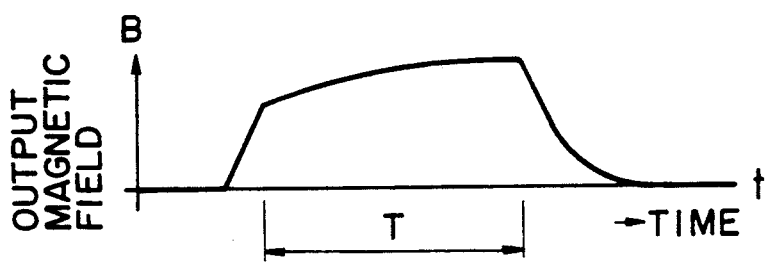
Figure 3A:
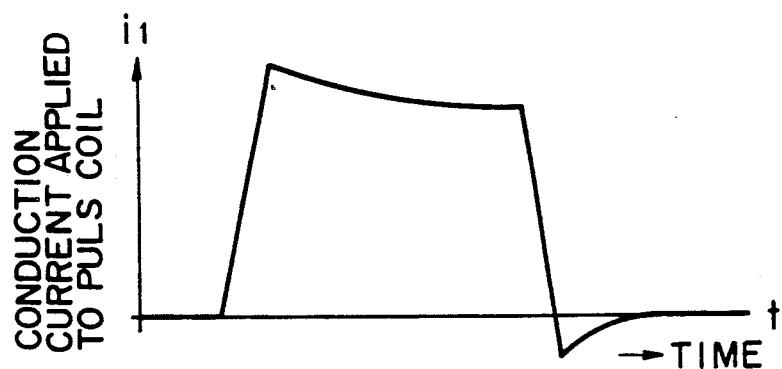
FIG. 3 respectively shows the waveform of a current to be applied to the pulsating magnetic field generating coil in a case where the magnetic field output by the coil in FIG. 1 is maintained at a fixed value for a predetermined period of time, that of the induced current in the inner cylinder and an output magnetic field.
Figure 3B:
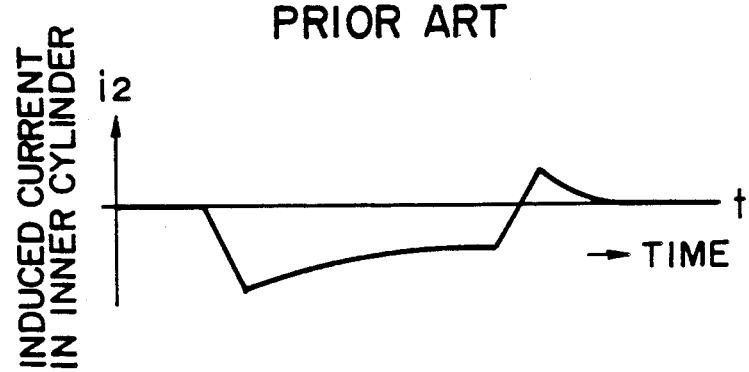
Figure 3C:
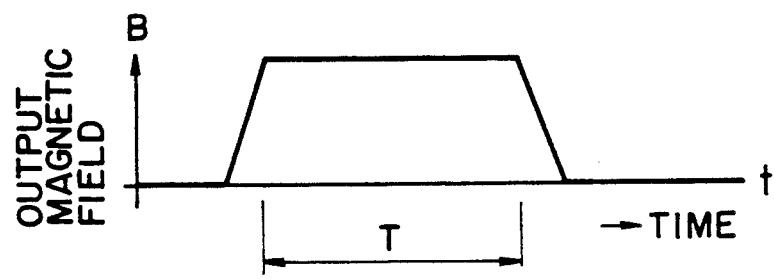
Figure 4:
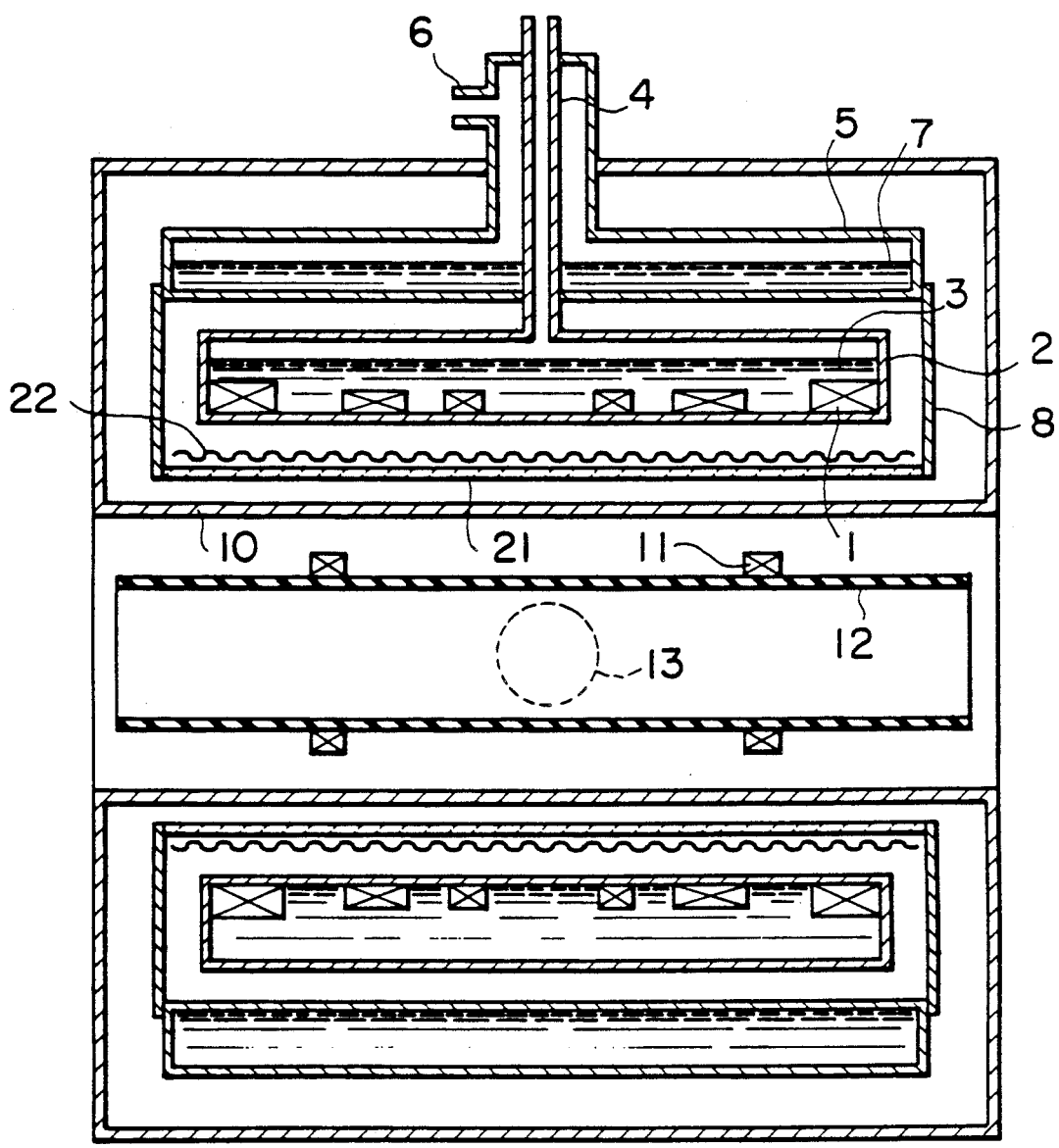
FIG. 4 is a cross-sectional view of a superconducting magnet device, showing an embodiment of the present invention.

Embodiments of the present invention will now be described below with reference to the accompanying drawings. FIG. 4 is a cross-sectional view of a superconducting magnet device showing a first embodiment of the present invention. In FIG. 4, the same reference numerals are used to denote parts which are the same as those in FIG. 1. In the superconducting magnet device shown in FIG. 4, a thermal shielding inner cylinder 21 which is in contact with the thermal shielding end plates 8 maintained at the liquid nitrogen temperature is made of a superconductor, such as a ceramic type superconductor, which is made superconductive by the liquid nitrogen contained in the liquid nitrogen tank 5. A heating wire 22 for making the inner cylinder 21 in normal conductive state is provided on the inner cylinder 21.

Next, the operation of this embodiment will be described. In a normal state in which a static magnetic field is set, since the inner cylinder 21 is in contact with the end plates 8, which are in turn in contact with the liquid nitrogen tank 5, the heat isolating inner cylinder 21 is at the liquid nitrogen temperature and, hence, is in a superconductive state.

Figure 5A:
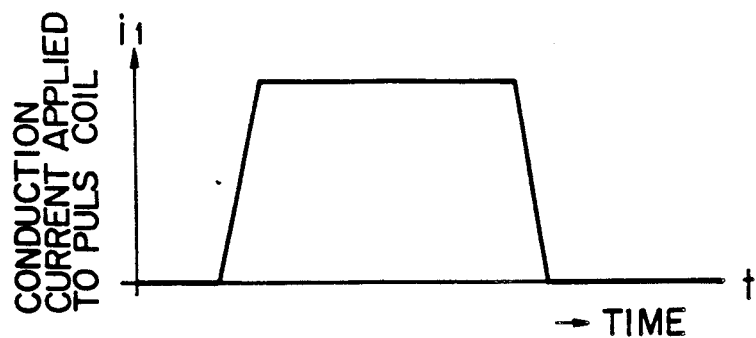
FIG. 5 illustrates the waveform of a current applied to a pulsating magnetic field generating coil in the superconducting magnet device of FIG. 4, that of an induced current in a inner cylinder and an output magnetic field.
Figure 5B:
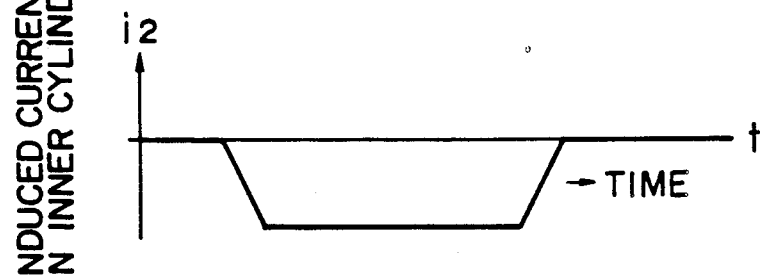
Figure 5C:
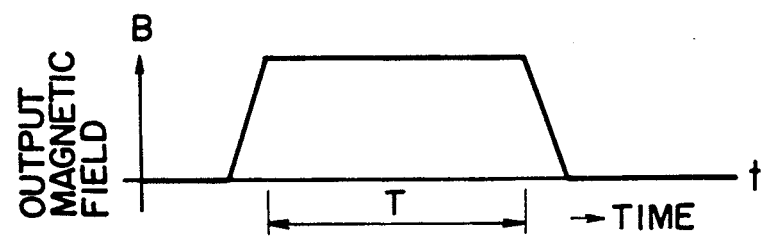

Since the resistance R of the heat isolating inner cylinder 9 in Equation (1) becomes zero, a current applied to the pulsating magnetic field generating normal conducting coils 11 and an induced current in the inner cylinder 21 have the following relationship.

$$L'\frac{di_2}{dt} = -M'\frac{di_1}{dt} \quad (2)$$

where
- $L'$: Self-inductance of the thermal shielding inner cylinder
- $M'$: Mutual-inductance between the pulsating magnetic field generating coils and the inner cylinder
- $i_1$: Current applied to the pulsating magnetic field generating coils
- $i_2$: Induced current in the inner cylinder Hence, when a current having a trapezoidal waveform shown in FIG. 5 (A) is applied to the pulsating magnetic field generating coils 11, attenuation of an induced current in the inner cylinder 21 due to the resistance thereof is eliminated, and a current having a trapezoidal waveform shown in FIG. 5 (B) therefore flows through it. In consequence, the magnetic field generated in the associated magnetic field space 13 by the current applied to the pulsating magnetic field generating coils 11 and by the induced current in the inner cylinder 21 has a fixed intensity for a period of time indicated by T, as shown in FIG. 5 (C).

A static magnetic field will be set in the following procedure.

In the conventional superconducting magnet device, the inner cylinder 9 is made of a normal conducting material. In consequence, when the superconducting coils 1 are excited, the induced current in the inner cylinder 9 is attenuated due to the resistance thereof, and a static magnetic field determined by the current applied to the superconducting coils 1 is finally generated.

On the other hand, in the superconducting magnet device according to the present invention, the thermal shielding inner cylinder 21 is made of, for example, a ceramic type superconductor which becomes superconductive at a temperature equal to or higher than the liquid nitrogen temperature. Such a inner cylinder 21 is connected to the liquid nitrogen tank 5 through the end plates 8 so that it is cooled to the liquid nitrogen temperature and is therefore in a superconductive state. In consequence, when the superconducting coils 1 are excited, the induced current generated in the inner cylinder 21 continues to flow without attenuation in such a manner as to oppose the magnetic field generated by the superconducting coils 1.

Hence, in order to generate a static magnetic field, the inner cylinder 21 made of a ceramic type superconducting material is charged to a normally conductive state by the energization of the heating wire 22. After setting of the static magnetic field, the inner cylinder 21 is returned to a superconductive state by the deenergization of the heating wire 22.

Figure 6:
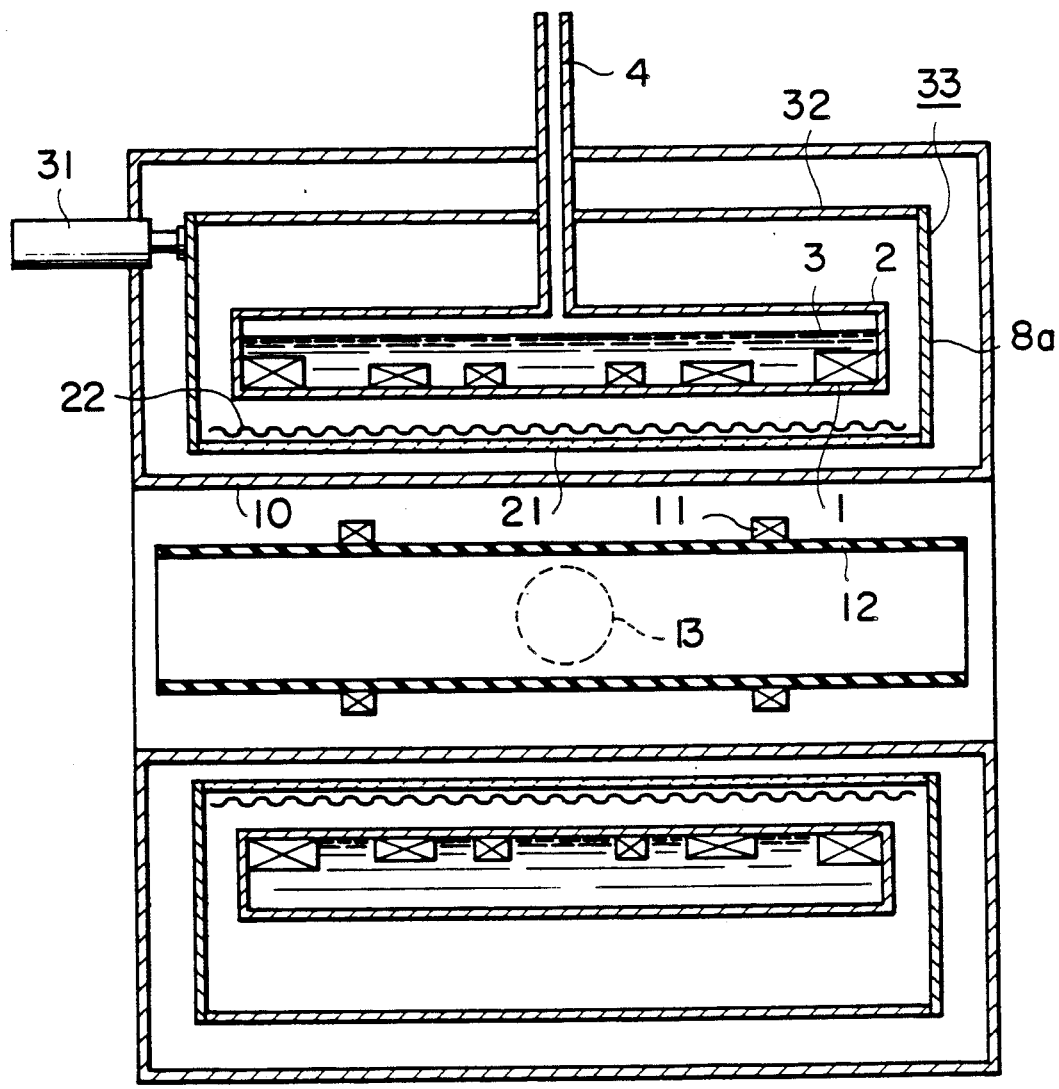
FIG. 6 is a cross-sectional view of a superconducting magnet device, showing another embodiment of the present invention.

In the above-described embodiment, the inner cylinder 21 which is connected to the liquid nitrogen tank 5 is made of a ceramic type superconductor. However, the superconducting magnet device may also be arranged, as shown in FIG. 6, such that a refrigerating machine 31 is provided in place of the liquid nitrogen tank 5 to cool a thermal shielding tank 33 including an outer cylinder 32, an inner cylinder 21, and two end plates 8a connecting the outer and inner cylinders 32 and 21, so as to provide a temperature equal to or lower than the liquid nitrogen temperature, such that the inner cylinder 21 of the thermal shielding tank 33 is made of a ceramic type superconductor, and a heating wire 22 is provided on the inner cylinder 21.

Figure 7:
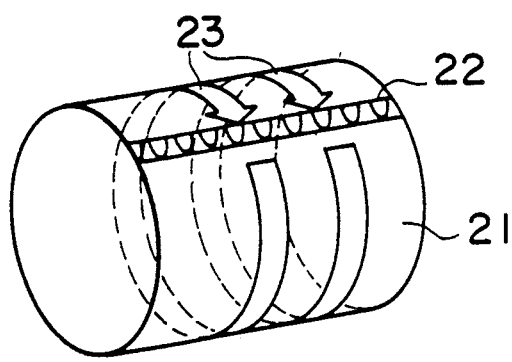
FIG. 7 shows one example of mounting of a heating wire on the inner cylinder.

Furthermore, the heating wire 22 may also be provided in such a manner as to cut across induced current loops 23 generated due to the excitation of a magnetostatic field, as shown in FIG. 7. In that case, there is no need for the heating wire 22 being provided on the overall surface of the inner cylinder 21. Further, the heat isolating inner cylinder 21 may be made normally conductive by a device other than a heating wire.

The inner cylinder of this invention is made of a ceramic type superconductor, preferably, a ceramic type superconductor oxide.

As will be understood from the foregoing description, in the present invention, the thermal shielding inner cylinder is made of a superconductor which becomes superconductive state at a temperature equal to or higher than the liquid nitrogen temperature. In consequence, it is possible to eliminate attenuation of an induced current generated, by energization of the pulsating magnetic field generating coil, in the inner cylinder which is maintained at the liquid nitrogen temperature. Thus, the magnetic field generated in the associated magnetic field space can be maintained at a fixed value for a desired period of time, and provision of an adjusting circuit in the power source for a pulsating magnetic field generating coil can be therefore eliminated, decreasing the production cost.

What is claimed is:
1. A superconducting magnet device comprising:
   cylindrical superconducting coil means for generating a static magnetic field;
   pulsating magnetic field generating coil means provided on the inner diameter side of said superconducting coil means;
   a cooling tank accommodating said superconducting coil means therein in a cooled, superconductive state;
   thermal shielding tank means surrounding said cooling tank and cooling the tank from the outside thereof, said thermal shielding tank means including an inner cylinder portion, an outer cylinder portion and end plates disposed at the two sides thereof for connecting said inner cylinder portion and said outer cylinder portion, said inner cylinder portion being made of a superconducting material and being located between said superconducting coil means and said pulsating magnetic field generating coil means;
   a thermal insulating vacuum tank surrounding said thermal shielding tank means and thereby restricting the entry of heat from the outside thereof.

2. A superconducting magnet device according to claim 1, wherein said inner cylinder portion of said thermal shielding tank means is formed of a ceramic type superconductor.

3. A superconducting magnet device according to claim 2, wherein said inner cylinder portion of said thermal shielding tank means is formed of a ceramic type superconductor oxide.

4. A superconducting magnet device according to claim 1, wherein said cooling tank is a liquid helium tank filled with liquid helium with said superconducting coil immersed therein, wherein said outer cylinder portion of said thermal sielding tank means is a liquid nitrogen tank filled with liquid nitrogen, and wherein said inner cylinder portion is made of a ceramic type superconductor which becomes superconductive at a temperature equal to or higher than the liquid nitrogen temperature.

5. A superconducting magnet device according to claim 4, wherein a heating means is provided on said inner cylinder portion of said thermal shielding tank means, in such a manner as to cut across an induced current loop generated by the excitation of a static magnetic field to cause said superconductor to become normally conducting.

6. A superconducting magnet device according to claim 5, wherein said heating means is a heating wire.

7. A superconducting magnet device according to claim 1, wherein said thermal shielding tank means includes a refrigerating machine, and wherein said inner cylinder portion is made of a ceramic type superconductor.

8. A superconducting magnet device according to claim 7, wherein a heating means is provided on said inner cylinder portion of said thermal shielding tank means which is made of said ceramic type superconductor in such a manner as to cut across an induced current loop generated by the excitation of a magnetostatic field so as to cause said superconductor to become normally conducting.

9. A superconducting magnet device according to claim 8, wherein said heating means is a heating wire.

10. A superconducting magnet device according to claim 7, wherein said thermal shielding tank means is cooled by the refrigerating machine to a temperature equal to or lower than the liquid nitrogen temperature, and wherein said inner cylinder portion is made of a ceramic type superconductor which becomes superconductive at a temperature equal to or higher than the liquid nitrogen temperature.

* * * * *